(12) United States Patent
Blosco et al.

(10) Patent No.: US 7,398,063 B2
(45) Date of Patent: Jul. 8, 2008

(54) SYSTEM AND METHOD FOR DETECTING RADIO FREQUENCY SIGNALS OVER A RANGE OF POWERS

(75) Inventors: John M. Blosco, Coventry, OH (US); James Julius Nahra, Mayfield Heights, OH (US)

(73) Assignee: Cisco Technology Inc., San Jose, CA (US)

( * ) Notice: Subject to any disclaimer, the term of this patent is extended or adjusted under 35 U.S.C. 154(b) by 518 days.

(21) Appl. No.: 10/996,902

(22) Filed: Nov. 23, 2004

(65) Prior Publication Data

US 2006/0111059 A1    May 25, 2006

(51) Int. Cl.
*H04B 1/04*   (2006.01)
*H04B 17/00*  (2006.01)

(52) U.S. Cl. ............... 455/127.1; 455/127.2; 455/115.1
(58) Field of Classification Search ............. 455/127.1, 455/127.2, 91, 117, 343.1, 572, 550.1, 127.5, 455/115.1, 115.3, 115.4
See application file for complete search history.

(56) References Cited

U.S. PATENT DOCUMENTS

| | | | | |
|---|---|---|---|---|
| 5,126,686 A | * | 6/1992 | Tam | 330/134 |
| 5,873,029 A | * | 2/1999 | Grondahl et al. | 455/126 |
| 6,108,527 A | * | 8/2000 | Urban et al. | 455/115.3 |
| 6,259,682 B1 | * | 7/2001 | Brown et al. | 370/311 |
| 6,272,336 B1 | * | 8/2001 | Appel et al. | 455/423 |
| 6,430,403 B1 | * | 8/2002 | Kossor | 455/126 |
| 6,442,378 B1 | * | 8/2002 | Aboukhalil et al. | 455/115.3 |
| 6,661,999 B1 | * | 12/2003 | Johnson et al. | 455/127.1 |
| 2005/0215198 A1 | * | 9/2005 | Fifield | 455/63.1 |

OTHER PUBLICATIONS www.digitalpowergroup.com, Peter Huber and Mark Mills, "Digital Broadcasting and RF Power," 8 pages total, Sep. 11, 2002, www.digitalpowergroup.com/dpr/archives/2002/harris,%20digital%20broadcasting%20and%20rf%20power,%20sep02.pdf.

* cited by examiner

*Primary Examiner*—Sonny Trinh
(74) *Attorney, Agent, or Firm*—Stolowitz Ford Cowger LLP

(57) ABSTRACT

The present invention is directed to a power detection circuit for use in a wireless transmitting device. The circuit makes use of multiple gain paths so that two or more scaling factors are provided. Each scaling factor allows the detector circuit to provide more ADC levels per dB and thus provide accurate power control over a wider power range than through the use of a single gain path and a single scaling factor.

14 Claims, 7 Drawing Sheets

SYSTEM AND METHOD FOR DETECTING RADIO FREQUENCY SIGNALS OVER A RANGE OF POWERS

FIELD OF THE INVENTION

The present invention relates generally to wireless networks and more specifically to a method and system of providing power control in transmitters over a wide range of power.

BACKGROUND OF THE INVENTION

In a typical wireless architecture a transmitting source is required to be kept at a relatively constant average power level over a period of transmission time. Because of temperature variations of individual gain stages along the transmit path (caused by higher current draw when transmitting) the output power tends to droop over time. The environmental temperature in which the transmitting device operates in can also cause the gain to fluctuate. In order to account for this difference in gain over temperature, a Radio Frequency (RF) power detection circuit is typically placed after the final gain stage of the transmit path in order to create a feedback signal which will adjust the gain in the beginning of the transmit path in order to account for the transmit path's droop or rise in gain. The detection typically consists of a power coupler, which couples a small portion of the electromagnetic waveform from the output of the last gain stage, and a properly biased diode circuit. The diode output is an analog voltage, which is an exponential function of the input power, in dBm. This signal is then scaled and fed into an Analog/Digital Converter (ADC), which converts the signal to a digital level used to adjust the power into the transmit path accordingly.

The problem with this method is that the analog signal created by the diode has a "sweet spot" due to the exponential behaviour of its response to RF energy. A sweet spot occurs when there are many ADC counts for a small range of power. At lower powers (power being referenced in dB) the voltage/dB output of the diode is lower than at higher powers. For example, for a diode at low powers, it may be necessary to raise the power 3 dB to get a 0.01V change, where at the higher powers, raising the power 3 dB will vary the voltage by 0.5V. At the ADC, this results in less voltage resolution and thus more A/D steps per dB, and causes inaccuracies in power feedback at the lower power levels. Typically the analog voltage from the diode is scaled, possibly by an Operational amplifier (Opamp) to use the full scale of the A/D window of the detector. The gain of the Opamp can properly scale the analog voltage, but the lower powers will still be represented with a lower resolution.

The typical method for resolving this problem was to set the sweet spot of the diode to centre at the higher powers that the device would detect and then live with less accurate output power at the lower powers. Another option is to not use the power detector at lower powers, assuming the parts will not heat up as much. Either option is subject to less accurate output power at lower levels over a wide range.

In summary, the problem is that there exists no practical solution to represent the analog exponential voltage created at the diode over a large range of power, e.g. greater than 10 dB to 15 dB, and retain bit resolution needed by the ADC to accurately report power. The present invention addresses this problem.

BRIEF DESCRIPTION OF THE DRAWINGS

For a better understanding of the present invention, and to show more clearly how it may be carried into effect, reference will now be made, by way of example, to the accompanying drawings which aid in understanding embodiments of the present invention and in which.

DETAILED DESCRIPTION OF THE INVENTION

Figure 1:
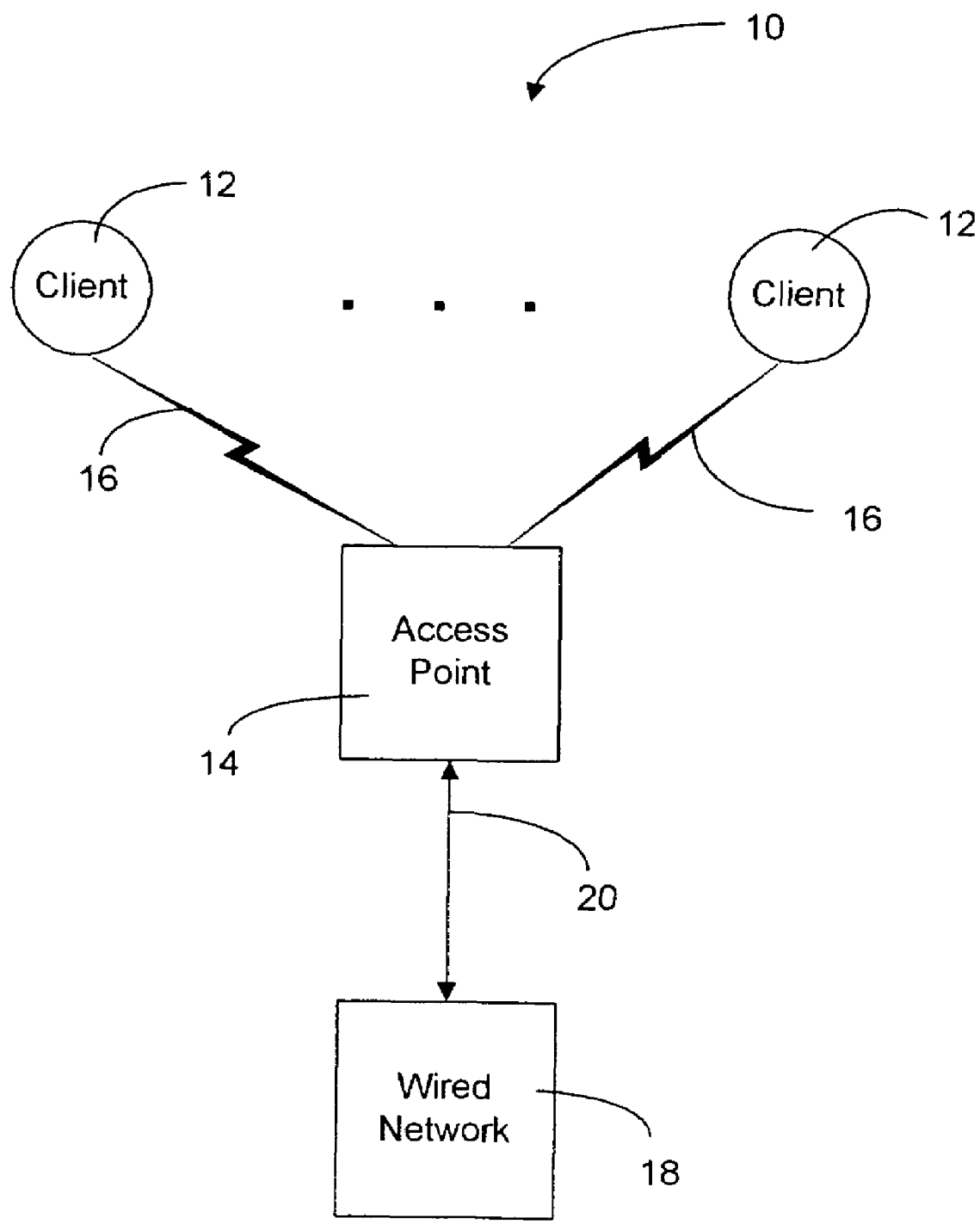
FIG. 1 is a block diagram of a wireless communication network.

Referring first to FIG. 1, a block diagram of a wireless communications network is shown generally as 10. Network 10 serves only as an example network to help the reader understand how the present invention may be utilized. Network 10 comprises a plurality of clients 12. Each client 12 is a transceiver, capable of transmitting and receiving wireless data. Such transceivers may include a Personal Digital Assistant, a wireless telephone, a laptop computer, or a desktop computer each equipped with a wireless communication device. Clients 12 transmit to and receive data from access point 14. Data is communicated via wireless links 16 utilizing a communications standard such as the IEEE 802.11 family of standards. Access point 14 serves as a hub for communications with clients 12. Access point 14 may receive or send data to a client 12 via wireless links 16. Access point 14 receives data from and transmits data to wired network 18 through Ethernet link 20. Wired network 18 is connected to a high speed physical network. Data received at network 18 from access point 14 may be sent to any number of networks (not shown) at a much faster rate than achieved by wireless links 16.

For the purposes of the present invention, both client 12 and access point 14 are also referred to as transmitting devices as it is in transmission of data where the present invention resides.

Figure 2:
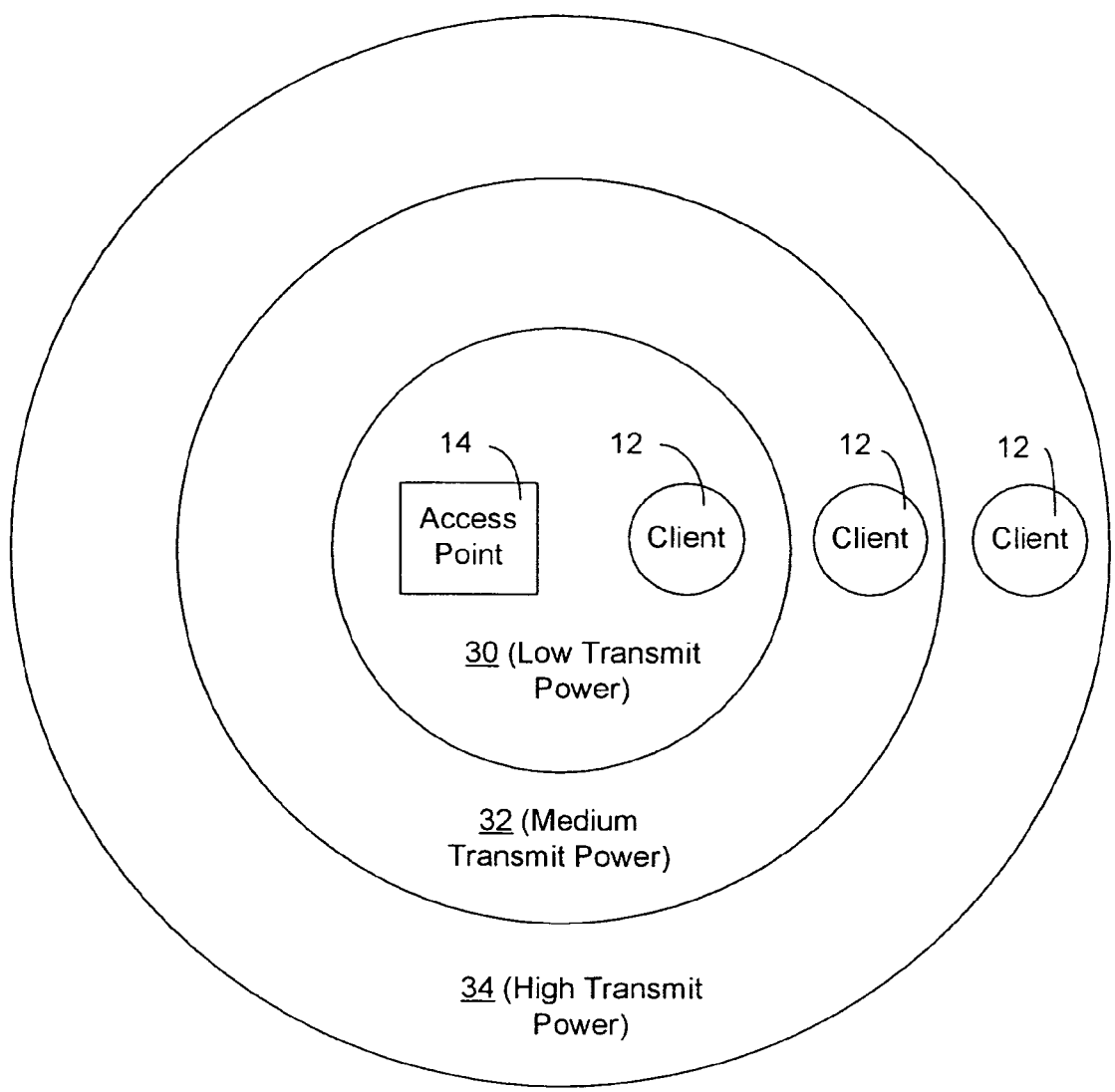
FIG. 2 is a plan view of wireless operating cells.

FIG. 2 is a plan view of wireless operating cells. FIG. 2 is meant as an illustration of how various operating cells (30, 32, 34) may utilize different power requirements based upon the distance of a client 12 from access point 14. Although three operating cells are shown, it is not the intent of the inventors to restrict the invention to three cells. Access point 14 and clients 12 may each control their transmission power. The smaller the operating cell, the less transmission power is required. By selecting the appropriate transmission power, the present invention is useful in establishing the transmission radius of both access point 14 and clients 12.

Figure 3:
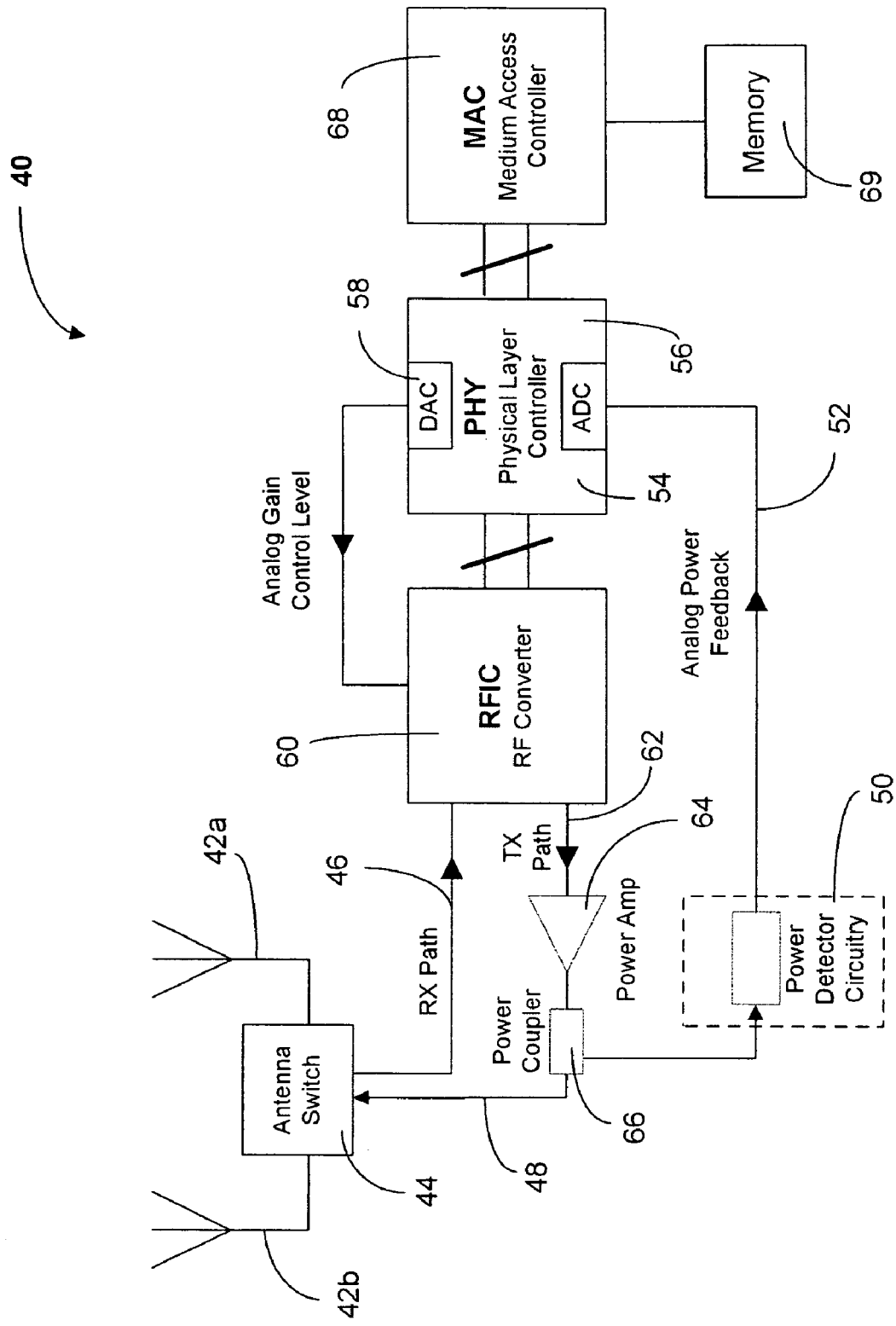
FIG. 3 is a block diagram of circuitry where the present invention may be utilized.

Referring next to FIG. 3 a block diagram of circuitry where the present invention may be utilized is shown generally as 40.

All signals to and from circuitry 40 pass through antennas 42a or 42b. Antenna switch 44 determines which antenna is utilized based upon the effects of multipath propagation. Antenna switch 44 passes on a receiving signal via path 46 and accepts a transmission signal via path 48.

The present invention resides in power detector circuitry 50. Power detector circuitry 50 is located in a transmit feedback path. To illustrate the transmit feedback path, let us start at detector 50. Detector 50 sends an analog power feedback signal along path 52 to an Analog to Digital Converter (ADC) 54. ADC 54 resides within Physical Layer Controller (PHY) 56 and converts the analog voltage from power detector circuitry 50 to a digital value. As one skilled in the art will appreciate, the ADC 54 and DAC 58 do not have to reside within PHY 56. For example, they could reside in RFIC 60 or MAC 68. This value is then compared with a value stored in memory 69, which was set during calibration for the power level. Calibration is performed at the time of manufacture of the transmitting device. Compensation is then made for any difference between the number set in memory and the provided value by Digital to Analog Converter (DAC) 58 located within PHY 56. This compensation is then passed to Radio Frequency Integrated Circuit (RFIC) 60 to adjust the gain. The output of RFIC 60 is a transmission signal on path 62, which passes through a power amplifier 64 and on to power coupler 66. Power coupler 66 samples the power level from power amplifier 64 and passes the result to power detector circuitry 50, and the transmit feedback path begins again.

To aid the reader in further understanding the present invention PHY 56, RFIC 60 and MAC 68 are typically implemented as Application Specific Integrated Circuits (ASICs). PHY 56 handles physical level functions for a packet, such as frequency, synchronization and packet length. When transmitting, RFIC 60 amplifies and converts an analog waveform to the appropriate signal level and frequency of transmission for Radio Frequency (RF). When receiving, RFIC 60 accepts an RF signal, converts it to an analog signal and passes it to PHY 56. MAC 68 deals with the incoming data at the packet level, for example handling addressing and security. MAC 68 also controls the switching for power detector circuitry 50.

Figure 4:
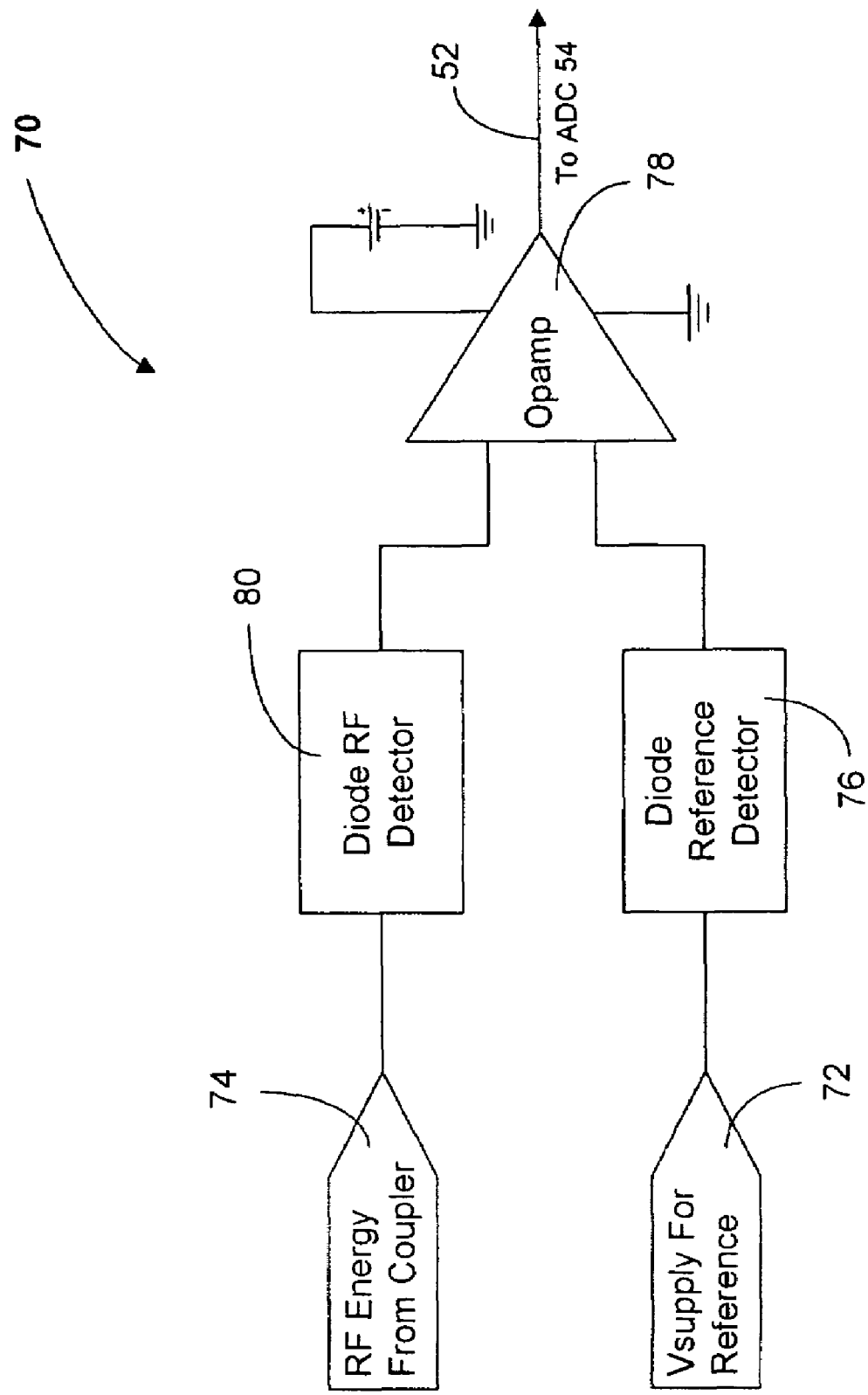
FIG. 4 is a block diagram of a prior art power detection circuit.

Referring now to FIG. 4 a block diagram of a prior art power detection circuit is shown generally as 70. In a typical power detection circuit there is a reference signal 72 which remains relatively fixed. Reference signal 72 is supplied to help provide better power control over variations in voltage and temperature. Typically signal 72 is obtained through a diode connected to a fixed power supply. Energy level signal 74 changes based upon the power level from the power coupler 66 (see FIG. 3). Diode reference detector 76 takes as input reference signal 72 and provides an analog output to Opamp 78. Similarly, diode RF detector 80 accepts as input energy level signal 74 and provides an analog output to Opamp 78. Opamp 78 then compares the input it has received and the difference is then used to create output 52 which is sent to ADC 54 (see FIG. 3) to match the ideal voltage range of ADC 54.

Figure 5:
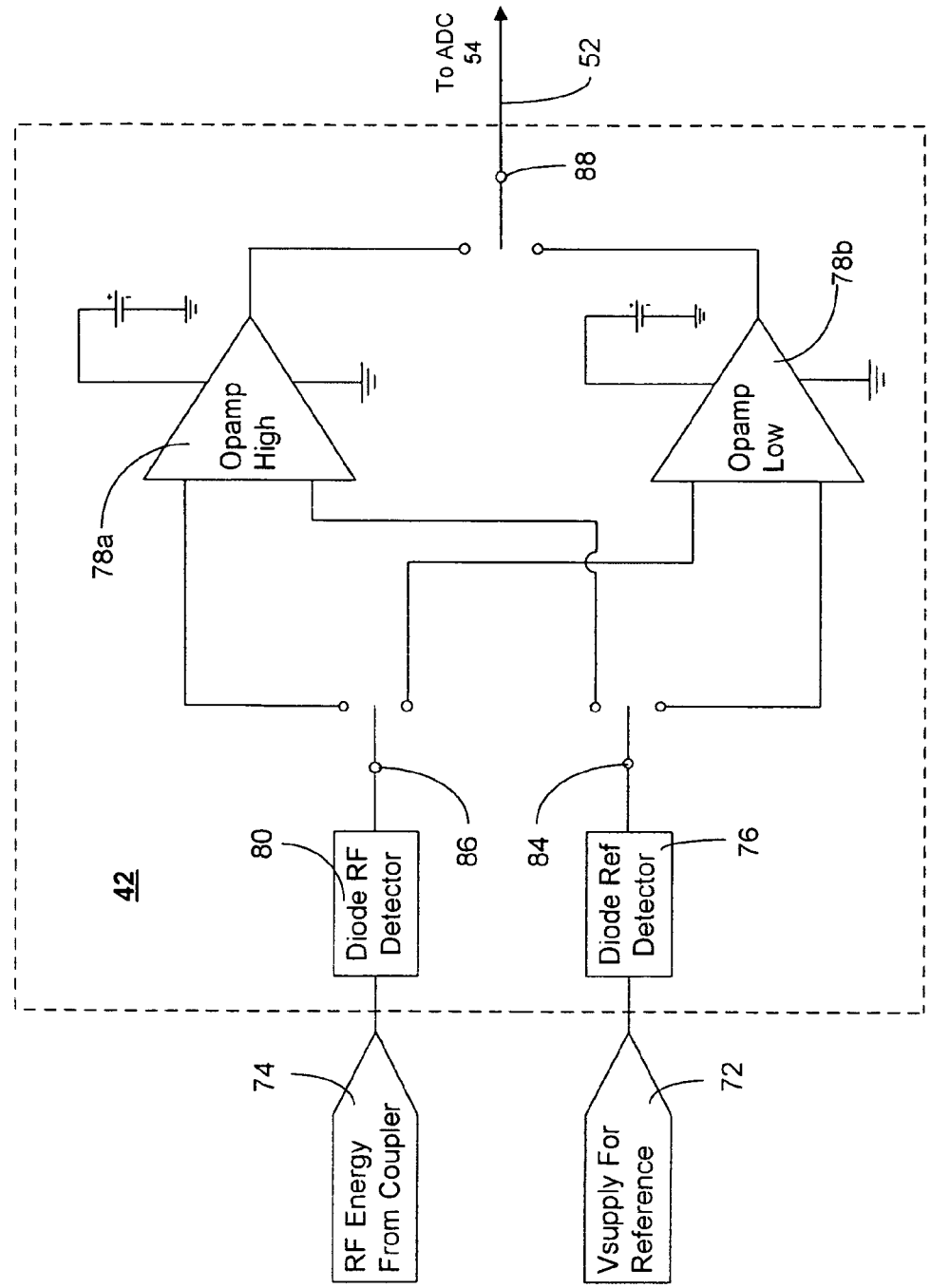
FIG. 5 is a block diagram of a the power detection circuit utilizing the present invention.

Referring now to FIG. 5 a block diagram of a power detection circuit utilizing the present invention is illustrated. The circuit illustrated is contained within power detector circuitry 50 of FIG. 3. Like numbers have been used for the common features of the prior art shown in FIG. 4. The limitation of the prior art circuitry of FIG. 4 is that the response of the power detector circuit provides good resolution (linear region) at higher power levels with a range of about 10 dB. Any range larger than that reduces the amount of resolution at lower power levels. The present invention makes use of two or more gain stages to provide better resolution at lower powers. FIG. 5 illustrates two gain stages but more may be utilized. In the case of "n" gain stages, switches 84 and 86 would require "n" paths. Each path would connect to an Opamp for a specific power range.

In the case of a typical WLAN system, one would expect feedback over a 20 dB range. Providing two different gain paths allows the power detector circuit to scale over a wider range. As the transmitter knows what power it will be operating at, it can adjust the logic controlling the gain to a higher setting for lower powers and a lower setting for higher powers.

FIG. 5 illustrates how this may be achieved through the use of two single pole double throw switches 84 and 86 which direct the output of diodes 76 and 80 respectively to the appropriate gain path. As shown Opamp 78a handles high gain in low power situations and Opamp 78b deals with low gain in high power situations. Single pole double switch 88 accepts the result from either Opamp 78a or 78b and the selected output 52 is then sent to ADC 54 (see FIG. 3).

Along with the adjustment of the gain, the power detector response can be improved by providing offset to an Opamp to better centre the response of the ADC. Adjusting the offset is something that can help improve the performance of the invention, but is not necessary. The offset can be adjusted in the Opamp with additional circuitry or by using an Opamp with specific offset adjustments built in. For example, if the power signal ranges from 0.1 to 1.0V and it is desired to scale it to an optimal ADC range of 0 to 2.0V, a gain of 2 would be added which would range the output signal from 0.2 to 2.0V. This would take advantage of the entire 0.2 to 2.0V range (1.8V) but at the lower end the lower 0.2V would not be used, which is a small portion of the entire ADC range. If the signal range were smaller, as it would be for a lower power, for example around 0.1 to 0.25, a gain of about 8 would result in a power output range from 0.8 to 2.0V. In this case, the lower 0.8V would not be utilized (compared to the 0.2V when the gain was 2) and the useable ADC range is now only 1.2V (compared to 1.8V with the gain of 2). A way to improve the ADC range for the high power case, would be to adjust the offset of the signal to better centre the ADC range and adjust the gain to keep full advantage of the 0 to 2V range. Depending upon the gain in the high gain state, an offset may or may not be needed. An offset simply improves the voltage range the ADC sees.

Figure 6:
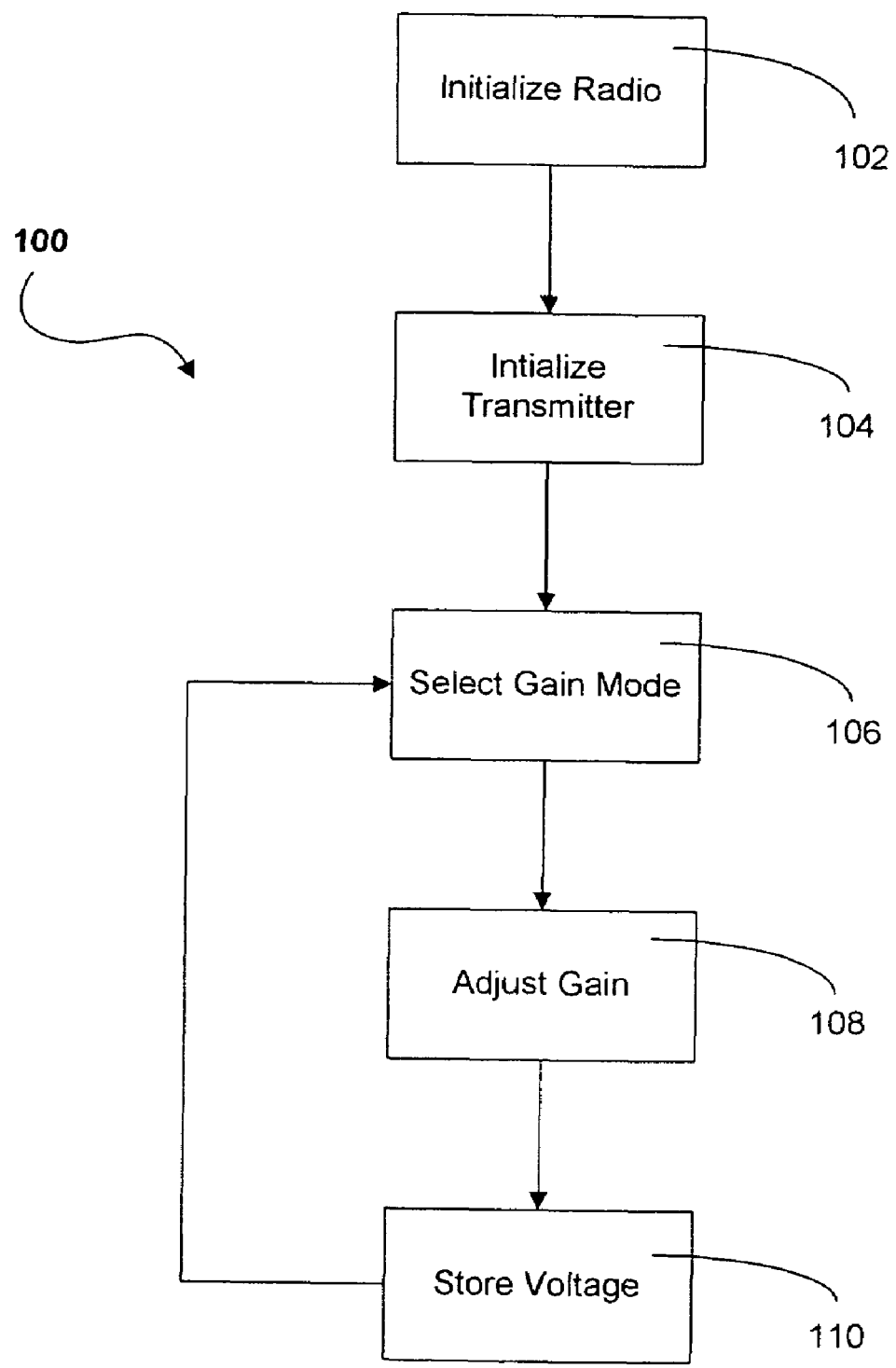
FIG. 6 is a calibration procedure flow chart.

Referring now to FIG. 6 a calibration procedure flow chart is shown generally as process 100. Process 100 is performed at the time of manufacture of a transmitting device. This is done during manufacture to set variables such as radio channel power level and modulation. Beginning at step 102 the radio contained within a transmitting device is initialized. At step 104 the transmitter of the transmitting device is turned on and the RF energy level out of the radio is monitored by a power meter. Step 102 simply means that the device is "powered-up" while 104 means the radio device is put into transmission mode. At step 106 the appropriate Opamp gain stage is enabled. With power sensor/power meter test gear connected to the radio device output port the transmission power of the device is measured and compared to the desired power level. At step 108 the gain is adjusted to ensure the power level out of the radio device matches the desired level. Once the desired level is reached the ADC value is read from the PHY 56 by the MAC 68 and that value is stored at step 110 into memory 69, for example in an Electrically Erasable Programmable Read Only Memory (EEPROM). The EEPROM contains a power calibration table that stores values for each power level and frequency for the transmitting device. Process 100 then returns to step 106 for each power level and frequency.

Whenever the transmitting device is in transmit mode, the device looks up the value in the power calibration table stored in memory 69 that it should see at ADC 54. This value will be dependent on what transmit power is specified. This power is specified by what the user of the device requires. Low power will extend battery life and require short communication range, or high power will extend communication and cell range. If the values do not match then the RFIC 60 will adjust the gain of one of the gain stages up or down in order to get the values to match within a certain tolerance.

Figure 7:
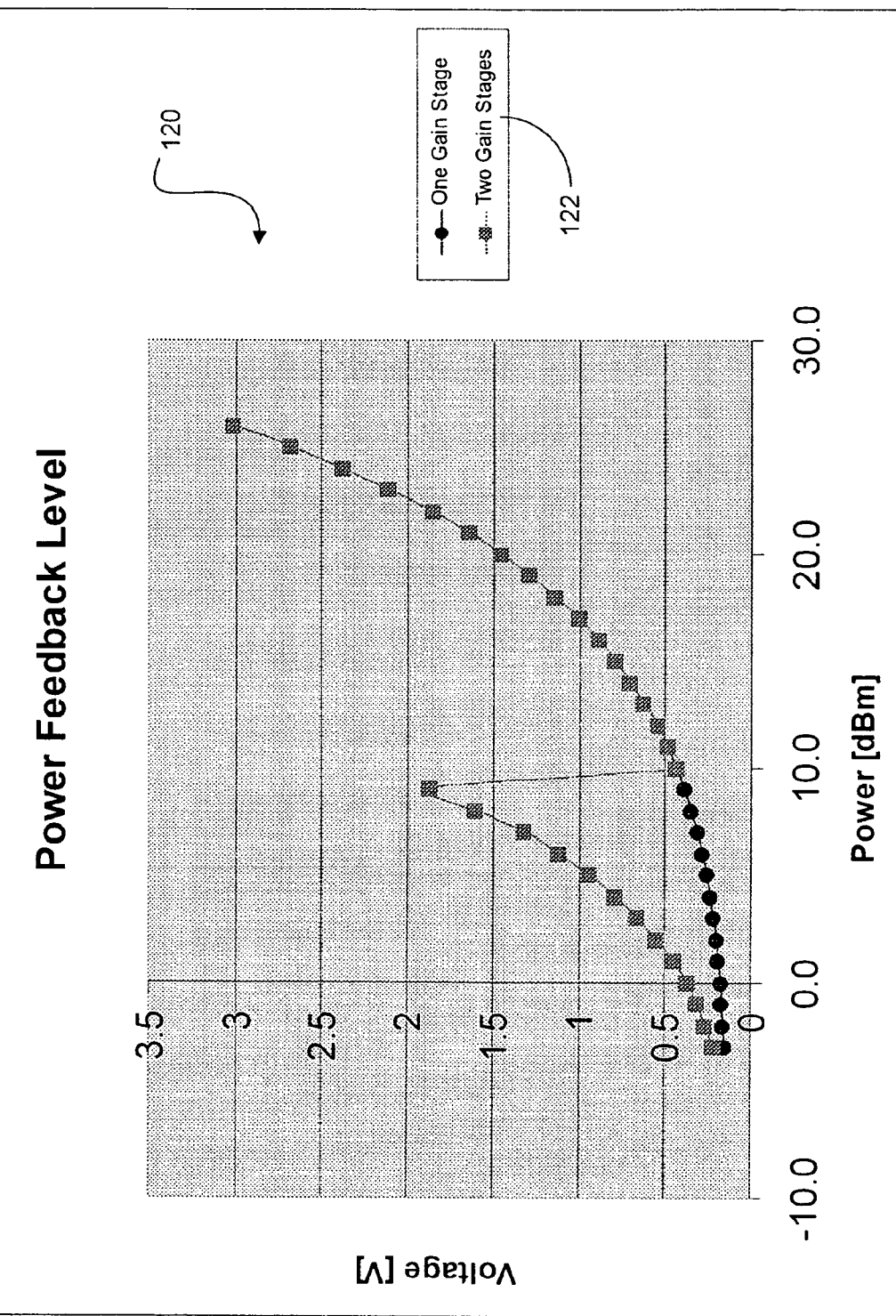
FIG. 7 is a graph of power feedback level.

Referring now to FIG. 7 a graph of power feedback level is shown generally as 120. Graph 120 represents a typical feedback signal with one gain stage (prior art) and two gain stages (the present invention) that is optimized to provide a 20 dB feedback range for an ADC that has a 2V window. Legend 122 indicates the plot line format for the results of a one gain stage and a two gain stage. At power levels of about 10.0 dBm, the two stages overlap. At higher power levels (10 dBm to 20 dBm) for the one gain stage there is an acceptable voltage resolution (V/dBm). At lower power levels, there is not much resolution, which results in less accuracy in the power control loop. If the power is divided into two different regions and the gain is adjusted, then the resolution of the lower powers is similar to the higher powers.

Although the invention has been described with reference to certain specific embodiments, various modifications thereof will be apparent to those skilled in the art without departing from the spirit and scope of the invention as outlined in the claims appended hereto.

We claim:

1. A power detector in a wireless transmitting device, said power detector comprising two or more gain paths wherein each gain path is selected based upon a power range;
   wherein said power detector comprises a diode Radio Frequency (RF) detector and a diode reference detector, each operatively connected to two or more Opamps.

2. The power detector of claim 1 wherein a Media Access Controller (MAC) is used for gain path selection.

3. The power detector of claim 1 wherein each of said Opamps adjust gain for a power range specific to each of said Opamps.

4. The power detector of claim 1 wherein said Opamps accept an offset.

5. The power detector of claim 1 wherein the output of the selected gain path is passed to an Analog to Digital Converter (ADC).

6. The power detector of claim 5 wherein said ADC compares the output of the selected gain path to a stored value and signals a Digital to Analog Convertor to adjust transmission power according to the ADC comparison.

7. A method, comprising:
   selecting a gain path from a plurality of gain paths;
   using the selected gain path to compare a reference detector signal and a Radio Frequency (RF) detector signal;
   adjusting transmit power of a wireless transmitter based at least in part on the comparison;
   providing an output of an Opamp circuitry to an Analog to Digital Convertor (ADC);
   comparing an output of the ADC to a stored calibration value to identify a difference;
   generating an analog gain control level by inputting the identified difference into a Digital to Analog Convertor (DAC); and
   adjusting said transmit power according to the generated analog gain control level.

8. The method of claim 7 wherein the comparison of the reference detector signal and the RF detector signal is performed using the Opamp circuitry.

9. The method of claim 8 wherein the reference detector signal and the RF detector signal are diode outputs.

10. A system for detecting power in a wireless transmitting device, comprising:
    means for utilizing two or more Opamps, wherein each Opamp is selected by said utilization means based upon a power range; and
    means for transferring outputs from a diode reference detector and a diode RF detector to the Opamps.

11. The system of claim 10 further comprising means for adjusting gain in each of said Opamps for a power range specific to each of said Opamps.

12. The system of claim 10 further comprising means for providing said Opamps with an offset.

13. The system of claim 10 further comprising means for transferring an Opamp output from at least one of the Opamps to an Analog to Digital Convertor (ADC).

14. The system of claim 13 further comprising:
    means for comparing the Opamp output to a stored value; and
    means for signaling a Digital to Analog Convertor (DAC) to adjust transmission power according to a comparison result.

* * * * *